United States Patent [19]

Farooq et al.

[11] Patent Number: 5,073,180
[45] Date of Patent: Dec. 17, 1991

[54] METHOD FOR FORMING SEALED CO-FIRED GLASS CERAMIC STRUCTURES

[75] Inventors: Shaji Farooq, Hopewell Junction; Govindarajan Natarajan, Pleasant Valley; Srinivasa S. N. Reddy, LaGrangeville; Richard A. Shelleman, Pleasant Valley; Nancy C. Stoffel, Ithaca; Rao V. Vallabhaneni, Wappingers Falls, all of N.Y.

[73] Assignee: International Business Machines Corporation, Armonk, N.Y.

[21] Appl. No.: 672,517

[22] Filed: Mar. 20, 1991

[51] Int. Cl.$^5$ .......................... H05K 3/46; C03C 8/24; C03B 19/06
[52] U.S. Cl. ...................................... 65/18.4; 29/830; 29/851; 65/23; 65/33; 156/89
[58] Field of Search ...................... 156/89; 65/23, 18.4, 65/33; 29/830, 851

[56] References Cited

U.S. PATENT DOCUMENTS

| | | | |
|---|---|---|---|
| 4,221,047 | 9/1980 | Narken et al. | 65/33 X |
| 4,234,367 | 11/1980 | Herron et al. | 156/89 |
| 4,413,061 | 11/1983 | Kumar et al. | 65/33 X |
| 4,504,339 | 3/1985 | Kamehara et al. | 156/89 |
| 4,627,160 | 12/1986 | Herron et al. | 29/830 |
| 4,649,125 | 3/1987 | Takeuchi et al. | 156/89 X |
| 4,772,346 | 9/1988 | Anderson et al. | 156/89 |

Primary Examiner—Robert L. Lindsay
Attorney, Agent, or Firm—Ira David Blecker

[57] ABSTRACT

A method for forming a co-fired glass ceramic structure including the steps of:
forming at least one green sheet of a first crystallizable glass in a thermally decomposable binder;
metallizing the green sheet with a pattern of conductive paste including conductive metal, a second crystallizable glass and a thermally decomposable binder, the pattern including at least one via;
firing the green sheet according to the following firing cycle steps:
a. preheating the green sheet to a first temperature in a furnace with a neutral or reducing ambient so as to effect pyrolysis of the thermally decomposable binders, wherein the first temperature is insufficient to coalesce the first crystallizable glass or the conductive paste;
b. introducing a steam ambient into the furnace and then heating the green sheet in the furnace at the first temperature to burn off the pyrolyzed binders;
c. replacing the steam ambient with a neutral or reducing ambient and raising the temperature to a second temperature to effect densification and crystallization of the first and second glasses;
d. maintaining the second temperature for a predetermined time to effect sealing of the at least one via wherein for a first portion of the predetermined time, the ambient in said furnace is a neutral or reducing ambient and for a second portion of the predetermined time, the neutral or reducing ambient is replaced with a steam ambient; and
e. cooling the structure.

60 Claims, 4 Drawing Sheets

METHOD FOR FORMING SEALED CO-FIRED GLASS CERAMIC STRUCTURES

BACKGROUND OF THE INVENTION

The present invention relates to the field of co-fired ceramic structures and, more particularly, to techniques for processing such structures.

Glass ceramic structures, usually and preferably multilayered, are used in the production of electronic substrates and devices. Many different types of structures can be used, and a few of these structures are described below. For example, a multilayered ceramic circuit substrate may comprise patterned metal layers which act as electrical conductors sandwiched between ceramic layers which act as insulators. The substrates may be designed with termination pads for attaching semiconductor chips, connector leads, capacitors, resistors, covers, etc. Interconnection between buried conductor levels can be achieved through vias formed by metal paste-filled holes in the individual glass ceramic layers formed prior to lamination, which, upon sintering, will become a sintered dense metal interconnection of metal-based conductor.

In general, conventional ceramic structures are formed from ceramic green sheets which are prepared by mixing a ceramic particulate, a catalyst (e.g., such as that disclosed in Herron et al. U.S. Pat. No. 4,627,160) a thermoplastic polymer binder, plasticizers, and solvents. This composition is spread or cast into ceramic sheets or slips from which the solvents are subsequently volatilized to provide coherent and self-supporting flexible green sheets. After blanking, stacking and laminating, the green sheets are eventually fired at temperatures sufficient to drive off the polymeric binder resin and sinter the ceramic particulates together into a densified ceramic substrate.

The electrical conductors used in formation of the electronic substrate may be high melting point metals such as molybdenum and tungsten or a noble metal such as gold. However, it is more desirable to use a conductor having a low electrical resistance and low cost, such as copper and alloys thereof.

Use of copper-based conductors in the multilayered structures requires the use of process techniques which do not oxidize the copper during the removal of binder resins and solvents, and sintering of the ceramic particulates together into the densified ceramic substrate.

For example, a typical firing cycle consists of burning the binder off in a steam ambient, typically water vapor plus hydrogen, and then replacing the steam ambient with an inert (neutral) ambient such as nitrogen and sintering the structure to its final densified state, followed by a cool down, again in an inert atmosphere such as nitrogen.

This seemingly simple firing cycle is, in fact, extraordinarily complex in nature and has taken years and large expense to achieve. The very fact that there are numerous patents in this area indicates the delicacy of the technology. Ambients, material sets and processing parameters cannot be considered to be interchangeable in this art. Those skilled in the art are painfully aware of the need to control a myriad of parameters in order to attain a suitable multilayer metallized part. Although the representative art does contain a variety of teachings with respect to materials and processes, substitution is not at all obvious in this field of endeavor. Rather, extensive experimentation is necessary in order to modify any teachings in this field. Is is, in fact, frequently necessary to invest substantial experimental effort in order to duplicate well-documented and patented techniques, let alone seek to modify facets of those techniques.

It is not an understatement to say that improvements in this art come in small steps rather than in great leaps.

The starting point for our discussion is Herron et al. U.S. Pat. No. 4,234,367, which is assigned to the assignee of the present invention. There, the basic firing cycle for glass ceramic structures is set forth. An initial preheating step in nitrogen is followed by binder burnoff in a steam ambient consisting of hydrogen and water vapor. The ratio of the hydrogen to the water vapor is precisely controlled so as to cause oxidation of the pyrolyzed binder residues, i.e. carbon, to carbon dioxide gas without causing oxidation of the copper. Oxidation of the copper, of course, is to be avoided since it is accompanied by a volumetric change which can be disastrous to the integrity of the glass ceramic structure. After binder burnoff, the atmosphere is changed to nitrogen and the temperature is raised to accomplish sintering of the structure wherein densification and coalescence takes place. Cooldown follows in the same nitrogen atmosphere. Note that Herron et al. prefers a neutral ambient for sintering since reducing ambients can occasion adhesion problems.

Kamehara et al. U.S. Pat. No. 4,504,339 discloses a firing cycle for a glass ceramic substrate wherein the preheating and binder burnout steps take place in an inert (neutral) atmosphere containing water vapor and the densification and coalescence of the glass ceramic particles takes place in an inert atmosphere.

Takeuchi et al. U.S. Pat. No. 4,649,125 discloses a series of firing atmospheres for a multilayer ceramic structure, each of which does not oxidize to any appreciable extent the metal conductor material, e.g. copper. The atmospheres may be nitrogen, nitrogen plus oxygen, nitrogen plus hydrogen, or hydrogen plus nitrogen plus water vapor. There is no indication where in the firing cycle these atmospheres are to be utilized or if they are to be utilized throughout the entire firing cycle. Such a limited teaching provides little or no guidance to one trying to improve the state of the art.

Bezama et al. U.S. patent application Ser. No. 07/103,768, filed Nov. 23, 1987, abandoned, assigned to the assignee of the present invention, discovered that in the firing cycle of Herron et al discussed above, there is a certain amount of residual carbon left after binder burnoff which can lead to problems later on during coalescence such as porosity due to the evolution of carbon dioxide gases. Accordingly, Bezama et al. inserted a drying step between binder burnoff and coalescence which suppresses the further oxidation of any residual carbon. The improvement of Bezama et al. has been found to be effective in reducing the amount of porosity in the glass ceramic body.

Chance et al. U.S. patent application Ser. No. 07/418,435, filed Oct. 6, 1989, assigned to the assignee of the present invention, recognized that notwithstanding the previous efforts of others to improve the firing of glass ceramic substrates, there still remained the problem that the metallic vias did not completely seal to the glass ceramic body after sintering. The resulting gaps and cracks were subsequently "backfilled" or filled with a polymer or other sealing material after sintering, as taught for example in Acocella et al. U.S.

patent application Ser. No. 07/503,495, filed Mar. 30, 1990, assigned to the assignee of the present invention. What Chance et al. proposed was to first, fire each multilayer ceramic structure generally according to the teachings of Herron et al. and then, pressure sinter in a nitrogen-rich atmosphere each glass ceramic structure in a special fixture.

While the pressure sintering of Chance et al. has worked well in practice, there are two main problems of a practical nature that need to be overcome. The first is that throughput is slow because of the need to perform a separate pressure sintering step for each glass ceramic structure and only one glass ceramic structure can fit in any one fixture at a time. The second is that the firing process is lengthened because of the pressure sintering step, thereby requiring longer processing times and extra expense.

It is apparent, therefore, that notwithstanding the prior efforts and improvements of others, there still remains a real need to improve the firing cycle for glass ceramic structures.

Accordingly, it is an object of the present invention to have an improved firing cycle for glass ceramic structures.

It is another object of the present invention to have an improved firing cycle without otherwise adversely impacting on throughput and processing time.

It is yet another object of the present invention to have an improved firing cycle which produces a glass ceramic structure having sealed vias without the need for further processing operations such as pressure sintering and backfill.

These and other objects of the invention will become more apparent after referring to the following description considered in conjunction with the accompanying drawings.

BRIEF SUMMARY OF THE INVENTION

The objects of the invention have been achieved by providing according to one aspect of the invention a method for forming a co-fired glass ceramic structure comprising the steps of:
  forming at least one green sheet of a first crystallizable glass in a thermally decomposable binder;
  metallizing said green sheet with a pattern of conductive paste comprising conductive metal, a second crystallizable glass and a thermally decomposable binder, said pattern comprising at least one via;
  firing said green sheet according to the following firing cycle steps:
   a. preheating said green sheet to a first temperature in a furnace with a neutral or reducing ambient so as to effect pyrolysis of said thermally decomposable binders, wherein said first temperature is insufficient to coalesce said first crystallizable glass or said conductive paste;
   b. introducing a steam ambient into said furnace and then heating said green sheet in said furnace at said first temperature to burn off said pyrolyzed binders;
   c. replacing said steam ambient with a neutral or reducing ambient and raising the temperature to a second temperature to effect densification and crystallization of said first and second glasses;
   d. maintaining said second temperature for a predetermined time to effect sealing of said at least one via wherein for a first portion of said predetermined time, the ambient in said furnace is a neutral or reducing ambient and for a second portion of said predetermined time, the neutral or reducing ambient is replaced with a steam ambient; and
   e. cooling said structure.

According to another aspect of the invention, there is provided a method for forming a co-fired glass ceramic structure comprising at least one metallized green sheet of a first crystallizable glass in a thermally decomposable binder having a pattern of conductive paste comprising conductive metal, a second crystallizable glass and a thermally decomposable binder, said pattern comprising at least one via, the method comprising the steps of:
  firing said green sheet according to the following firing cycle steps:
   a. preheating said green sheet to a first temperature in a furnace with a neutral or reducing ambient so as to effect pyrolysis of said thermally decomposable binders, wherein said first temperature is insufficient to coalesce said first crystallizable glass or said conductive paste;
   b. introducing a steam ambient into said furnace and then heating said green sheet in said furnace at said first temperature to burn off said pyrolyzed binders;
   c. replacing said steam ambient with a neutral or reducing ambient and raising the temperature to a second temperature to effect densification and crystallization of said first and second glasses;
   d. maintaining said second temperature for a predetermined time to effect sealing of said at least one via wherein for a first portion of said predetermined time, the ambient in said furnace is a neutral or reducing ambient and for a second portion of said predetermined time, the neutral or reducing ambient is replaced with a steam ambient; and
   e. cooling said structure.

According to a final aspect of the invention, there is provided a method for forming a co-fired glass ceramic structure comprising a plurality of stacked and laminated metallized green sheets of a first crystallizable glass in a thermally decomposable binder, at least one of the metallized green sheets having a pattern of conductive paste comprising conductive metal, a second crystallizable glass and a thermally decomposable binder, said pattern comprising at least one via, and at least one of the metallized green sheets having a pattern of conductive paste comprising conductive metal, a thermally decomposable binder and no crystallizable glass, the method comprising the steps of:
  firing said green sheets according to the following firing cycle steps:
   a preheating said green sheets to a first temperature in a furnace with a neutral or reducing ambient so as to effect pyrolysis of said thermally decomposable binders, wherein said first temperature is insufficient to coalesce said first crystallizable glass or said conductive paste;
   b. introducing a steam ambient into said furnace and then heating said green sheets in said furnace at said first temperature to burn off said pyrolyzed binders;
   c. replacing said steam ambient with a neutral or reducing ambient and raising the temperature to a second temperature to effect densification and crystallization of said first and second glasses;

d. maintaining said second temperature for a predetermined time to effect sealing of said at least one via wherein for a first-portion of said predetermined time, the ambient in said furnace is a neutral or reducing ambient and for a second portion of said predetermined time, the neutral or reducing ambient is replaced with a steam ambient; and e. cooling said structure.

DETAILED DESCRIPTION OF THE INVENTION

In the present invention, green sheets are prepared and metallized according to conventional practice, as described in great detail in Herron et al. Briefly, a slip of material comprising a crystallizable glass, binders, plasticizers, etc. is cast and then doctor bladed to a uniform thickness. The green sheet is thereafter blanked to the desired size. Metal paste, consisting of metallic particles and binder, is then screened onto the green sheets to fill the vias and form the wiring lines. A plurality of such green sheets are stacked and laminated and subsequently fired.

Figure 1:
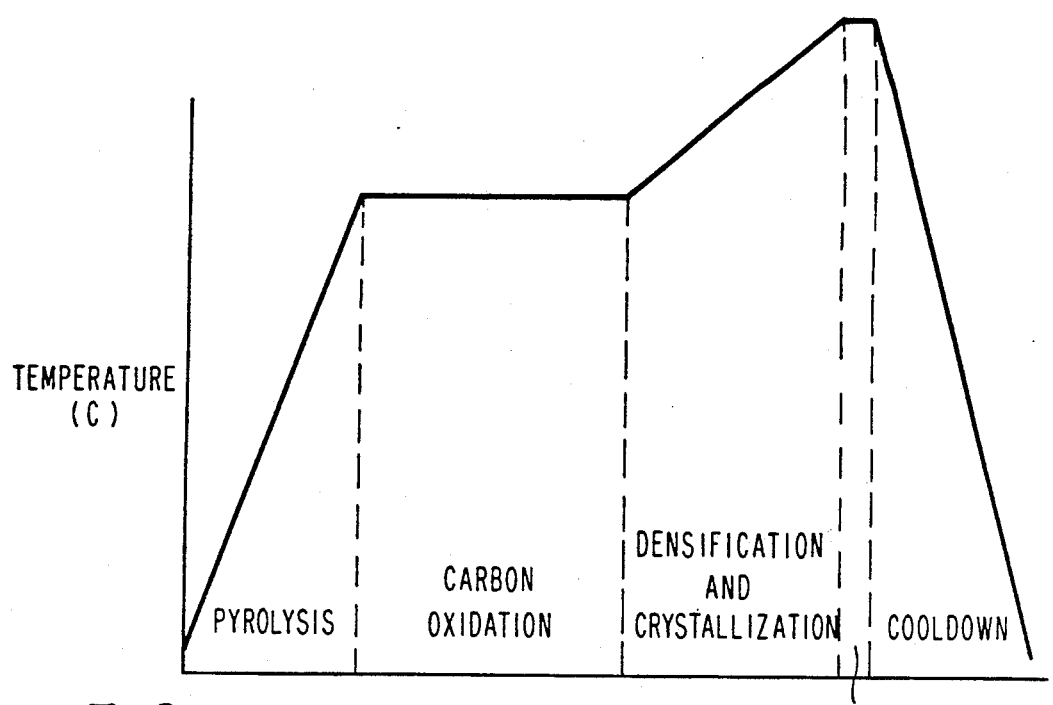
FIG. 1 is a prior art firing cycle.

A typical firing cycle is illustrated in FIG. 1. The first step of the firing cycle is pyrolysis where the temperature is gradually raised from room temperature to an elevated temperature. A neutral or reducing ambient, with respect to the metallic particles, is preferably used during this step.

While holding at this elevated temperature, a steam ambient is introduced to cause oxidation of the pyrolyzed carbon. This steam ambient, however, is insufficient to cause oxidation of the metallic particles. Thereafter, the ambient is changed to forming gas (nitrogen plus hydrogen) and the temperature is gradually raised. The substrate is now undergoing densification and crystallization of the glass particles to form a glass ceramic. The temperature is gradually raised until the recrystallization temperature is reached. After a short hold at this temperature (during which nitrogen may be switched for the forming gas), the temperature is gradually lowered to room temperature.

This firing cycle is an improvement over the firing cycle of Herron et al. but there still remained the problem that the vias did not seal to the glass ceramic body. During subsequent wet processing of the substrates, liquids would penetrate into the gaps between the vias and the ceramic body and become entrapped there. This created an undesirable reliability problem.

As taught by Chance et al., pressure sintering was utilized in an effort to seal these gaps.

The present inventors have found an improved way to achieve the same result as Chance et al. without the necessity of undergoing pressure sintering.

According to the present invention, there will be at least one green sheet (comprising a first crystallizable glass in a thermally decomposable binder) that is metallized with a pattern of conductive paste comprising conductive metal, a second crystallizable glass and a thermally decomposable binder. Typically, this paste will be used to fill the vias of the green sheet but it can be used for screening wiring lines, etc. if desired.

The metallic particles preferably are copper or copper alloys but can also be other metals such as gold or palladium if desired. The present invention will be discussed hereafter in terms of copper but it should be understood that these other metals are included as well.

TABLE I

| GLASS CERAMIC COMPOSITIONS (WEIGHT percent) | | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| $SiO_2$ | 55.0 | 54.5 | 54.5 | 52.3 | 57.8 | 60.0 | 50.0 | 53.9 | 54.0 | 55.0 | 60.0 | 54.5 |
| $Al_2O_3$ | 21.1 | 21.0 | 21.0 | 19.7 | 22.2 | 18.2 | 22.9 | 20.7 | 21.0 | 21.0 | 17.0 | 20.0 |
| MgO | 22.3 | 19.8 | 19.8 | 24.0 | 16.0 | 17.8 | 22.2 | 19.6 | 19.0 | 18.0 | 18.0 | 20.0 |
| $B_2O_3$ | 1.2 | 1.0 | 1.0 | 1.0 | 1.0 | 1.0 | 1.1 | 1.0 | 1.0 | 1.0 | 1.0 | 1.0 |
| $P_2O_5$ | 0.3 | 2.7 | 2.7 | 3.0 | 3.0 | 3.0 | 1.8 | 2.8 | 3.0 | 3.0 | 3.0 | 1.5 |
| $CeO_2$ | | 1.0 | | | | | | | | | | |
| MnO | | | 1.0 | | | | | | | | | |
| $ZrO_2$ | | | | | | | | | 2.0 | | | 2.0 |
| CaO | | | | | | | | | | 2.0 | | 1.0 |
| NiO | | | | | | | | | | | 2.0 | |
| $Li_2O$ | | | | | | | | | | | 1.0 | |
| $Fe_2O_3$ | | | | | | | | | | | | |
| $Na_2O$ | | | | | | | | | | | | |
| $TiO_2$ | | | | | | | | | | | | |
| ZnO | | | | | | | | | | | | |
| CuO | | | | | | | | | | | | |

| | 13 | 14 | 15 | 16 | 17 | 18 | 19 | 20 |
|---|---|---|---|---|---|---|---|---|
| $SiO_2$ | 57.0 | 55.0 | 47.0 | 53.9 | 54.0 | 54.5 | 54.0 | 54.0 |
| $Al_2O_3$ | 21.0 | 21.0 | 33.5 | 20.8 | 22.0 | 21.3 | 22.0 | 21.0 |
| MgO | 20.0 | 22.0 | 13.5 | 19.6 | 20.0 | 19.9 | 20.0 | 22.0 |
| $B_2O_3$ | 1.0 | 2.0 | 3.0 | 1.0 | 1.0 | 1.0 | 1.0 | 1.0 |
| $P_2O_5$ | 1.0 | | 3.0 | 2.7 | 2.0 | 2.8 | 2.0 | |
| $CeO_2$ | | | | | | | | |
| MnO | | | | | | | | |
| $ZrO_2$ | | | | | | | | |

TABLE I-continued

| GLASS CERAMIC COMPOSITIONS (WEIGHT percent) | | | | |
|---|---|---|---|---|
| CaO | | | | |
| NiO | | | | |
| Li$_2$O | | | | |
| Fe$_2$O$_3$ | 2.0 | | | |
| Na$_2$O | | 1.0 | | |
| TiO$_2$ | | | 1.0 | |
| ZnO | | | | 1.0 |
| CuO | | | | 2.0 |

The second crystallizable glass is understood to be separate and distinct from the first crystallizable glass that forms the green sheet itself, although they may have the same composition. The crystallizable glasses are preferred to be the cordierite glass ceramics such as those disclosed in Kumar et al. U.S. Pat. No. 4,413,061. Some preferred glass ceramic compositions are disclosed in Table I.

When choosing the appropriate glasses for the present invention, it is important to keep in mind the usual parameters such as strength and dielectric constant. It is also important, for purposes of the present invention, to look at the thermal coefficient of expansion (TCE) of each of the glasses. It is preferred that the TCE of the first crystallizable glass is equal to or greater than the TCE of the second crystallizable glass. This relationship is important in order to avoid the vias causing the glass ceramic body to form gross macroscopic cracks. It is thus preferred that the first and second crystallizable glasses have different compositions so that their respective thermal coefficients of expansion differ somewhat.

Figure 2:
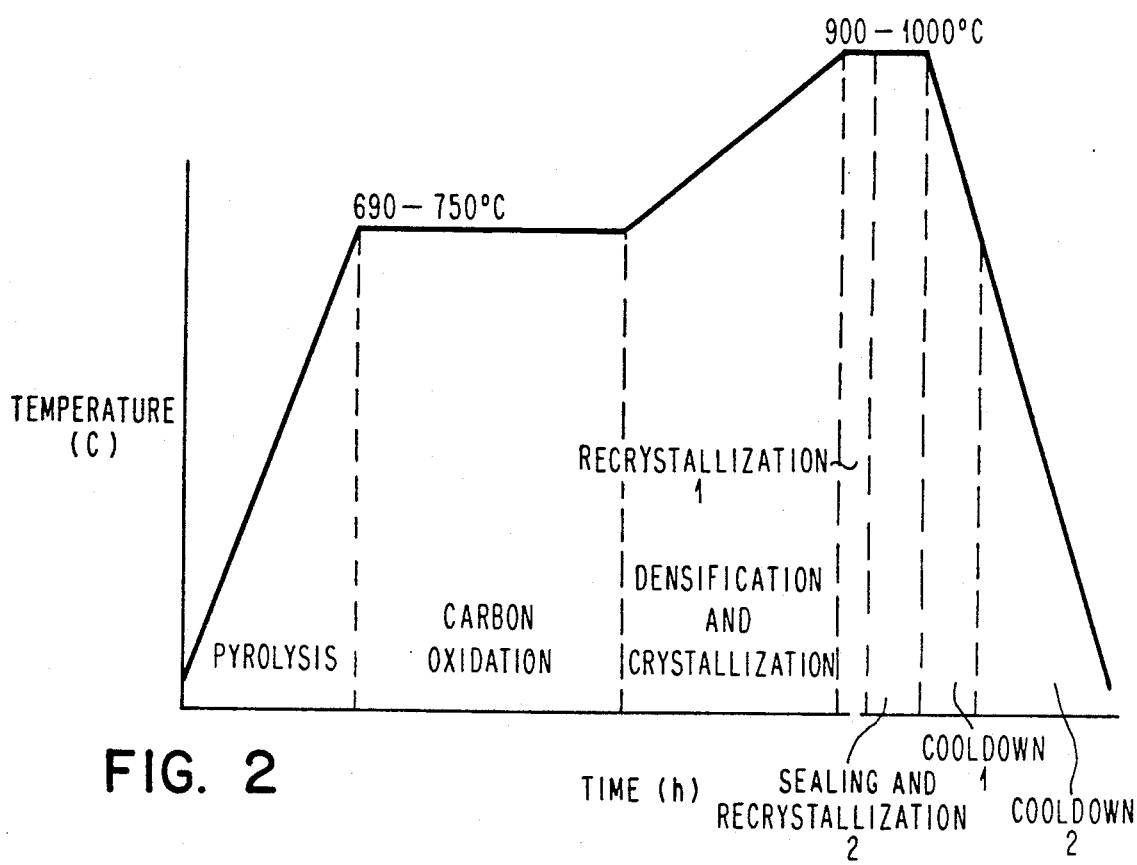
FIG. 2 is a firing cycle according to the present invention.

The metallized green sheet is then fired according to the firing cycle illustrated in FIG. 2. As is apparent, the pyrolysis, carbon oxidation and densification steps are substantially identical to that disclosed in FIG. 1. It should be understood that the first elevated temperature at which carbon oxidation takes place is insufficient to coalesce the first crystallizable glass or the conductive paste containing the second crystallizable glass particles. This first temperature should be in the range of about 690 to 750 degrees Centigrade.

After replacing the steam ambient with a neutral or reducing ambient (preferably a reducing ambient) and raising the temperature to a second temperature to effect densification and crystallization of the first and second glasses, the second temperature is maintained for a predetermined time to effect sealing of the via or vias in the green sheet. During a first portion of this predetermined time, usually up to about 1 hour, the neutral or reducing ambient is maintained. It is preferred that during this first portion of time, the ambient be a neutral one. During a second portion of this predetermined time, usually 3 to 5 hours, the neutral or reducing ambient is replaced with a slightly oxidizing (with respect to the copper) steam ambient which effects sealing of the via to the glass ceramic body. The second temperature is preferably in the range of about 900 to 1000 degrees Centigrade.

It must be understood that up until the present invention, it had been considered extremely undesirable to introduce an oxidizing steam ambient at this point in the firing cycle since it was felt that any oxidation of the copper that would occur would be accompanied by gross volume changes, thereby leading to cracking of the substrates. It has been found, however, that precisely controlled oxidizing steam ambients are both effective and beneficial in sealing the vias.

Figure 3B:
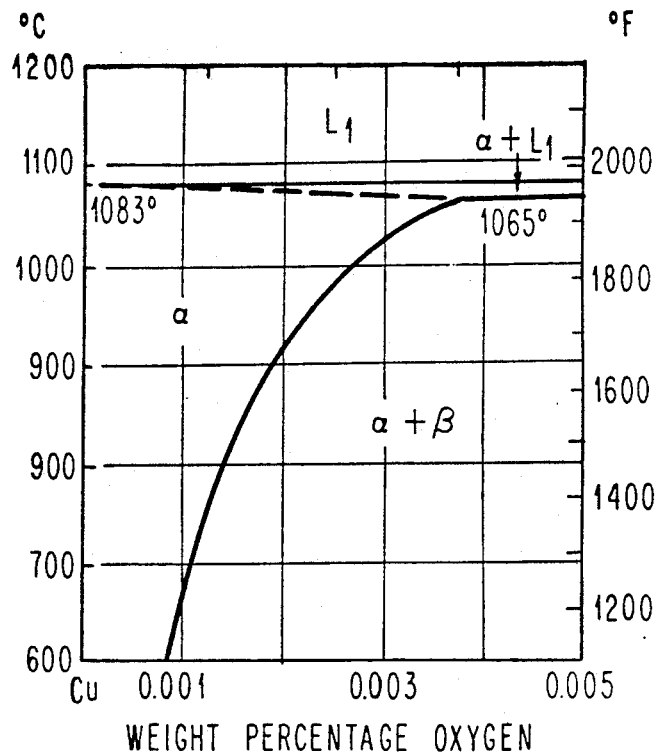
FIGS. 3A and 3B are phase diagrams for the copper-oxygen system.
Figure 3A:
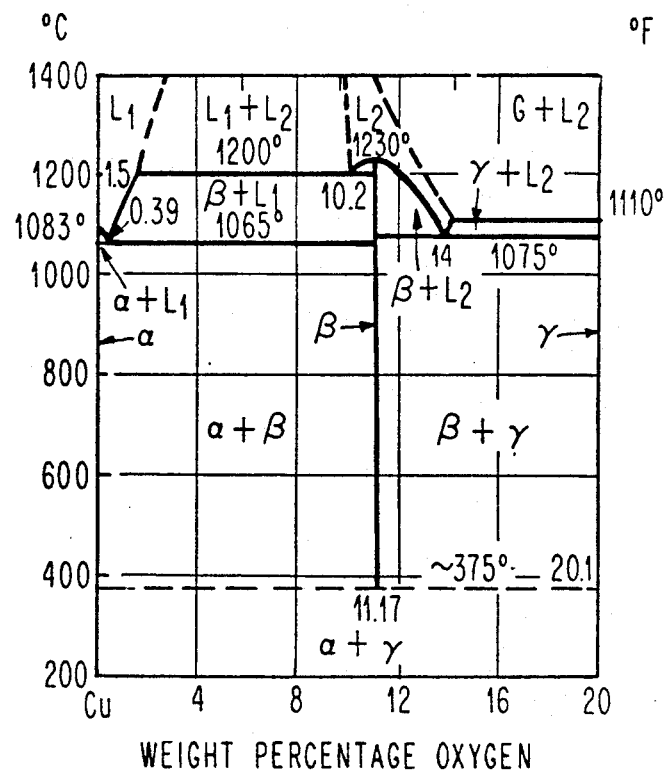
Figure 4:
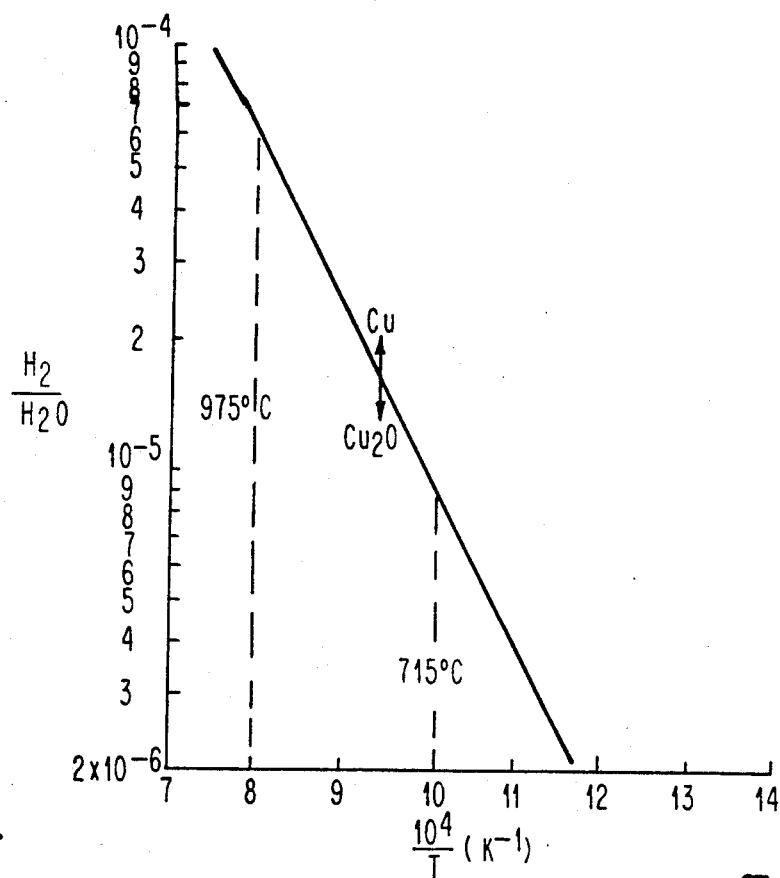
FIG. 4 is a plot of the precise $H_2/H_2O$ ratio needed to achieve sealing of the vias with the glass ceramic body according to the present invention.

The precise amounts of oxygen to be incorporated by the steam ambient can be determined by reference to FIGS. 3 and 4. FIG. 3A is a partial phase diagram for the copper-oxygen system. FIG. 3B is an enlarged portion of the partial phase diagram of FIG. 3A showing the alpha and alpha+L$_1$ fields in greater detail. The single phase alpha field is a solid solution of oxygen in copper. Beta is Cu$_2$O. According to the present invention, it is desirable to stay on the line, or just to the left of the line, that divides the single phase alpha field from the two phase alpha plus beta field in order to accomplish sealing without the accompanying gross volumetric changes that would occur if the beta phase were to be present. Referring now to FIG. 4, this line is expressed on a graph of H$_2$/H$_2$O concentration versus the inverse of temperature. It is desirable to stay on the line or just above it. For example, at 975 degrees Centigrade, the H$_2$/H$_2$O concentration is preferably 7 to $9 \times 10^{-4}$. As the temperature changes, the H$_2$/H$_2$O ratio would change. Generally speaking, the quantity of oxygen present should be insufficient to substantially convert the copper lines and vias to Cu$_2$O.

It is unclear as to why the exposure to a slightly oxidizing atmosphere with respect to the copper would be so advantageous to the present invention. While not wishing to be held to any particular theory, it is believed that either a copper oxide film forms on the copper particles, thereby enhancing bonding to the glass ceramic particles, or a solid solution of copper and oxygen forms (as predicted by the phase diagram) which serves to lower the interfacial energy between the copper and glass ceramic, thereby also enhancing the bonding between them. Regardless of the theory, this invention has been found to work extremely well in practice.

After the sealing step, the structure may be cooled to room temperature in a neutral, but not reducing, ambient. More preferably, the second temperature, at which sealing occurs, is also the recrystallization temperature for the first and second glasses. The recrystallization temperature is the final temperature (or highest temperature) that the glass ceramic structure sees. This final temperature should be insufficient to melt the copper or whatever conductive metal is used.

It has been found to be advantageous to break the cooldown phase into two separate steps. In the first step, the structure is cooled, while in the steam ambient, to a temperature less than the second temperature. This temperature is nominally 700 degrees Centigrade but may be in the range of 900 to 400 degrees Centigrade. The steam ambient is then replaced with a neutral ambient, essentially nitrogen, and cooled the remainder of the way to room temperature. A reducing ambient would not be desirable during the final phase of the cooldown as it could undo the sealing of the vias described above.

After burning off the binder, but before densification and crystallization, there may be inserted a drying step as taught by Bezama et al., discussed above. The steam ambient of carbon oxidation is replaced with a reducing ambient, for example nitrogen plus 1 to 10 volume percent hydrogen. The temperature may be held constant, lowered somewhat or raised somewhat (but not high enough to begin densification) with respect to the binder burnoff temperature to prevent any residual carbon from oxidizing. Such a drying step is usually preferred. After the drying step, the same atmosphere may be used for densification or a neutral ambient may be introduced.

Figure 5:
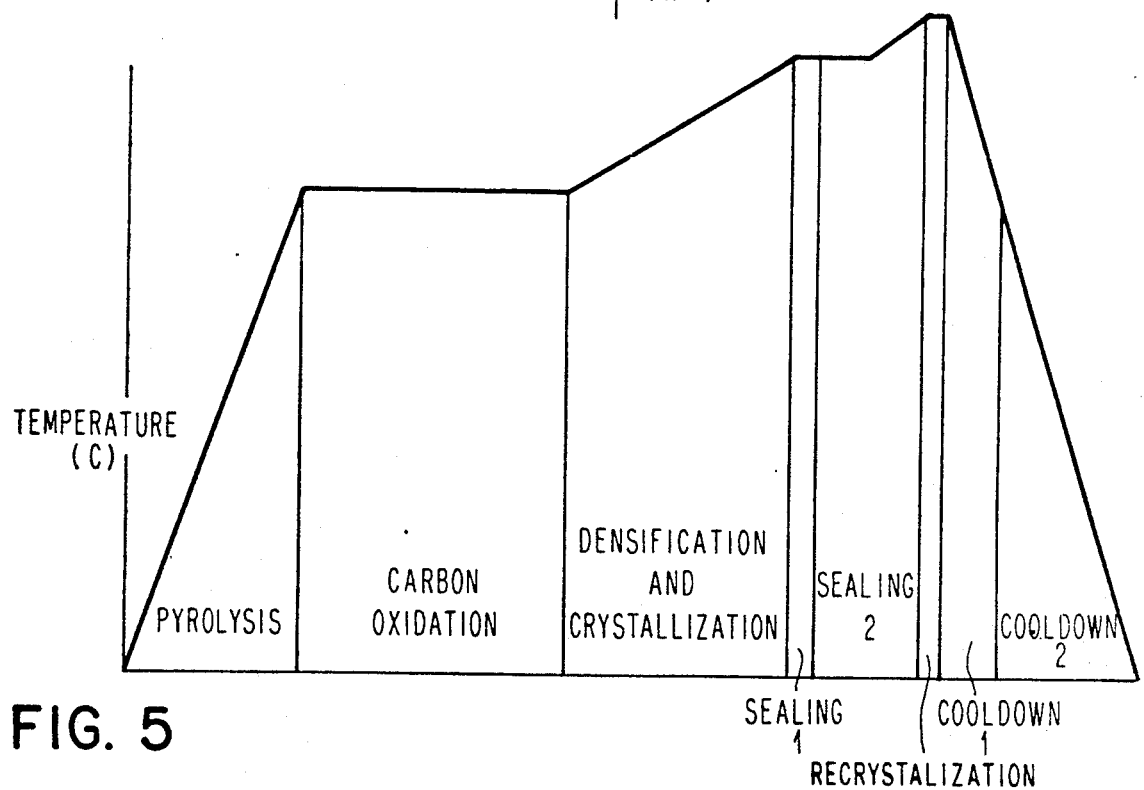
FIG. 5 is an alternative embodiment of the firing cycle according to the present invention.

Referring now to FIG. 5, there is an alternative embodiment of the present invention. The pyrolysis, carbon oxidation, densification and sealing stages are essentially as discussed before. In this embodiment, however, the second temperature at which sealing takes place is insufficient for recrystallization. Thus, after sealing steps 1 and 2, for a total of about 6 hours, the temperature is ramped up at up to 2 degrees Centigrade/minute to a final temperature of about 975 degrees Centigrade, and held there for about 1 to 2 hours while maintaining the steam ambient, to effect recrystallization of the first and second glasses. This final temperature should be insufficient to melt the conductive metal. Cooldown may then proceed in 1 or 2 steps as discussed above.

As alluded to earlier, the metallized green sheet and the finished glass ceramic structure have at least one composite via and usually will have a plurality of such vias. A composite via, as defined herein, comprises a conductive metal/ceramic mixture. The rationale for such a composite via is that by adding ceramic material to the via, the thermal coefficient of expansion (TCE) of the via can be adjusted to more closely match that of the surrounding ceramic body. In this way, stresses that might ordinarily cause gross macroscopic cracking in the via or the ceramic body can be avoided. Unfortunately, the more ceramic material that is added to the via, the more the resistivity of the via increases, at some point to an undesirable level. It thus becomes apparent that a happy medium must be reached between the competing factors of TCE and resistivity.

Figure 6:
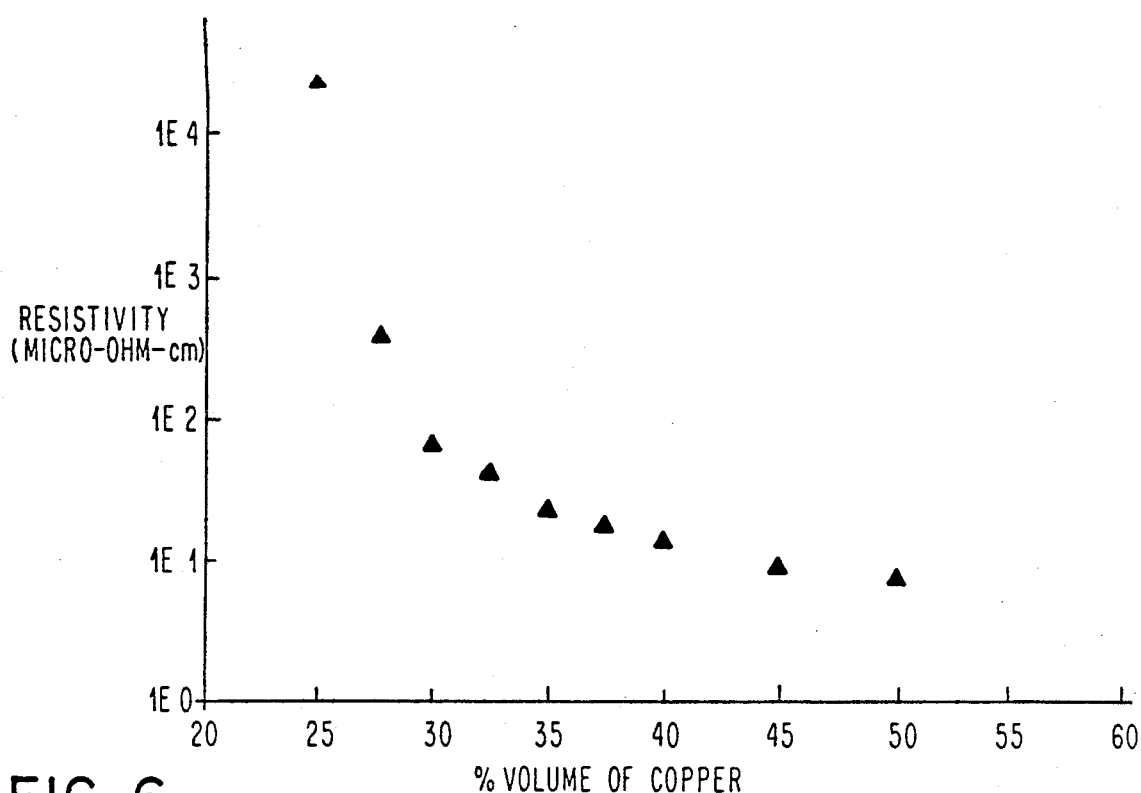
FIG. 6 is a plot of electrical resistivity versus volume percent of copper for copper/glass ceramic composite materials.

Referring now to FIG. 6, the electrical resistivity for a copper/glass ceramic composite material is plotted. As can be seen, the resistivity rises with decreasing amounts of copper. With less than 30 volume percent copper in the composite material, the resistivity dramatically rises. Accordingly, the minimum amount of copper in the composite material to be used in a via should be equal to or greater than 30 volume percent. More preferably, for purposes of the present invention, the minimum should be about 35 volume percent.

Figure 7:
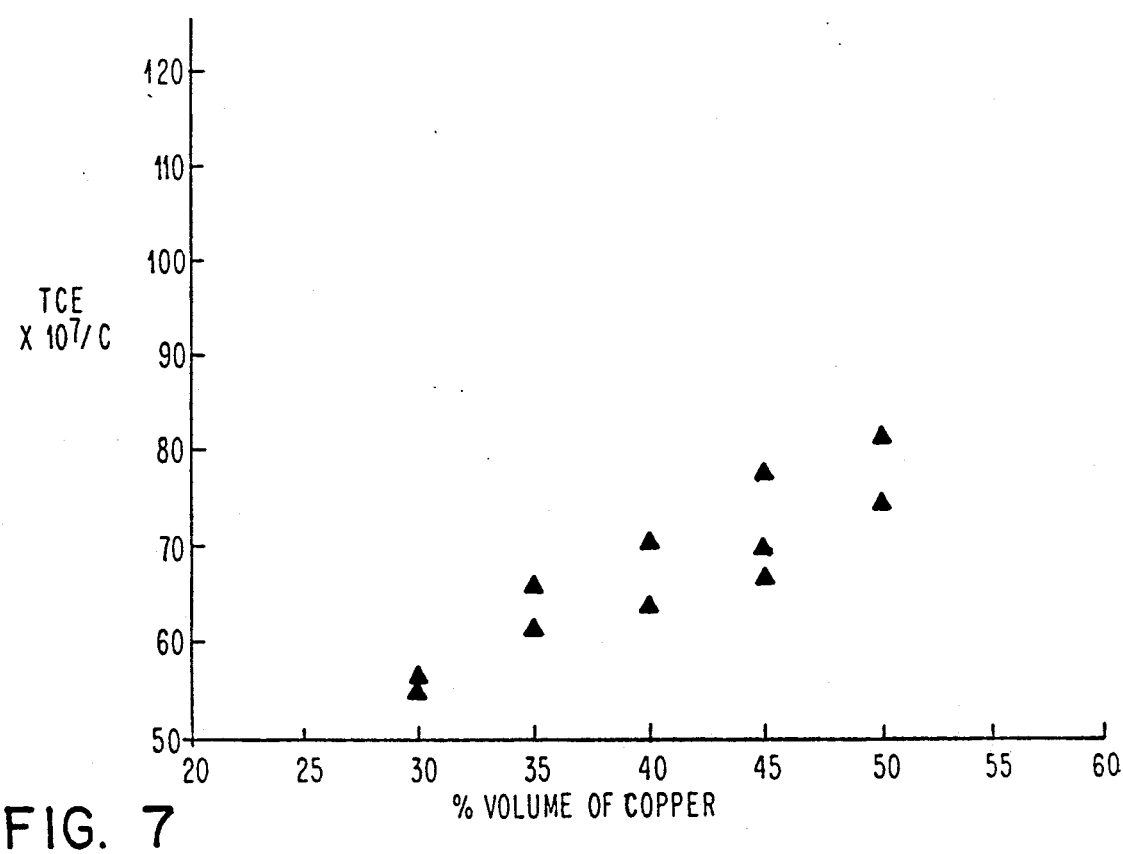
FIG. 7 is a plot of thermal coefficient of expansion versus volume percent of copper for copper/glass ceramic composite materials.

Referring now to FIG. 7, the TCE for the same composite material is plotted. As the volume percent of copper rises, the TCE of the composite material also rises. For the sake of comparison, the TCE of a typical glass ceramic substrate is about 30 on the same scale. The maximum amount of copper should be equal to or less than about 50 volume percent, and more preferably should be about 45 volume percent or less.

If the results from FIGS. 6 and 7 are compared, the preferred composition ranges for the metal/ceramic material to be used in the composite via are 30 to 50 volume percent conductive metal and 70 to 50 volume percent glass ceramic. More preferably, the ranges are 35 to 45 volume percent conductive metal and 65 to 55 volume percent glass ceramic. For purposes of the present invention, the most preferred composition is 40 volume percent conductive metal and 60 volume percent glass ceramic. As should be apparent for the present invention, the preferred conductive metal is copper and the preferred glass ceramic is a cordierite glass ceramic.

The results shown in FIGS. 6 and 7 were obtained by using copper and glass ceramic particles having a median particle size of 1.8 microns (range of 0.8-5.3 microns) and 3.0 microns (range of 0.9-14.9 microns), respectively, as determined by laser light scattering measurement. By further decreasing copper particle size relative to the glass ceramic particles, the resistivity of the composite can be decreased further at equivalent volume percent copper. Or, by further decreasing copper particle size relative to the glass ceramic particles, the volume percent of copper particles can be decreased down to about 27 or 28% without unduly increasing the resistivity of the composite.

It is generally preferred that the metallic particles that make up the conductive paste should be of extremely fine particle size. The ratio of the glass particle size to the copper particle size should preferably be at least 1.5 or higher for best results. Copper particles may be comminuted to achieve a fine particle size of 2 microns or less. Alternatively, CuO particles having a particle size of 2 microns or less may be mixed with the second crystallizable glass particles and lightly ball milled to assure intimate mixing. The mixture of particles is then exposed to a reducing atmosphere, for example pure hydrogen, for a time sufficient to reduce the CuO to elemental copper. Preferably, the reducing step should be done at an elevated temperature of about 600 degrees Centigrade or less.

When the reducing atmosphere causes the CuO to change to elemental copper, there is an accompanying volumetric change (the volume decreases about 60%) which causes fine CuO particles to become even finer elemental copper. In this way, it is easier to obtain copper particles of the desired extremely fine particle size.

Up until the present time, the discussion of the invention has primarily centered on glass ceramic structures having a green sheet with a composite via. The technology of the present invention has broad applicability to multilayer substrates and so there will typically be a plurality of such green sheets which are stacked and laminated according to conventional practice prior to sintering. At least one of these green sheets will have a conductive paste comprising conductive metal and a thermally decomposable binder but not the second crystallizable glass.

Typical multilayer structures contemplated by the present invention will comprise a plurality of metallized green sheets having the conductive paste without the second crystallizable glass and at least one metallized green sheet having the conductive paste with the second crystallizable glass. Normally, and preferably, there will be a plurality of metallized green sheets having the conductive paste with the second crystallizable glass. These latter metallized green sheets are ideally suited for sealing the vias to the glass ceramic body, as will be demonstrated hereafter; therefore, they should be situated on the top and/or bottom of the laminated stack of green sheets. Two to four such green sheets should be sufficient. The remaining metallized green sheets, that is, those having the conductive paste without the second crystallizable glass, should form the central or inner part of the stack.

The reason for this stacking order is as follows. Those green sheets having the conductive paste without the crystallizable glass have lower resistivity and so, to avoid undesirable signal delays, should form the bulk of the substrate. Those green sheets having the conductive paste with the second crystallizable glass have higher resistivity but, most importantly, also have sealed vias. These metallized green sheets should thus form the outer portion (i.e., the top and/or bottom, preferably the top and bottom) of the laminated stack.

It should be understood, however, that there may be situations where sealed vias throughout the substrate are desirable, in which case metallized green sheets having the conductive paste with the second crystallizable glass form the entire substrate laminate.

The advantages of the present invention will become more apparent after referring to the following examples.

EXAMPLES

Example 1

Green glass ceramic substrate laminates were prepared in the conventional way such as that disclosed in the Herron et al. patent. The crystallizable glass in each green sheet had the composition, in weight percent:

| | |
|---|---|
| $SiO_2$ | 55.0 |
| $Al_2O_3$ | 21.1 |
| $MgO$ | 22.3 |
| $B_2O_3$ | 1.3 |
| $P_2O_5$ | 0.3 |

The majority of the green sheets had a conventional copper paste for the vias and lines, i.e., without a second crystallizable glass.

The top and bottom four green sheet layers of the laminate had a copper paste according to the present invention in the vias. The copper paste in these four layers comprised 40 volume percent copper plus 60 volume percent second crystallizable glass. The paste also comprised conventional binders, etc. The composition of the second crystallizable glass, in weight percent, was:

| | |
|---|---|
| $SiO_2$ | 55.0 |
| $Al_2O_3$ | 21.23 |
| $MgO$ | 20.0 |
| $B_2O_3$ | 1.0 |
| $P_2O_5$ | 2.77 |

This particular (second) crystallizable glass was selected because it has a TCE less than the TCE of the crystallizable glass of the green sheet.

The thickness of the substrate laminates was about 400 mils.

The substrate laminates were then fired according to the firing cycle of the present invention. Thus, the temperature was ramped up at a rate of 1 to 2 degrees/minute from room temperature to 715 degrees Centigrade in an atmosphere of 70% water vapor/30% $N_2$ to initiate pyrolysis of the organic materials. The atmosphere was then replaced with a steam ambient with an $H_2/H_2O$ concentration range of $5\times10^{-5}$ to $2.5\times10^{-3}$ and held at this temperature for about 20 hours to oxidize the organic residues, thus accomplishing binder burnoff. Subsequently, the atmosphere was replaced with a forming gas atmosphere and then the temperature was ramped up at a rate of up to 2 degrees/minute to 975 degrees Centigrade. During this phase of the firing cycle, the crystallizable glass undergoes densification and crystallization.

At this point in the typical prior art firing cycle, the temperature would be held constant at 975 degrees Centigrade with the atmosphere being 100% $N_2$ or a forming gas mixture consisting of, for example, nitrogen plus 1 to 10% hydrogen. According to the prior art, cooldown would begin after a predetermined time (about 1 to 2 hours) at this recrystallization temperature.

According to the present invention, however, recrystallization is done in two steps. The first step is a short heating at 975 degrees Centigrade in a neutral ($N_2$) atmosphere for up to one hour. The atmosphere is then changed to steam with the $H_2/H_2O$ ratio at $7-9\times10^{-4}$. This critical step is continued for 3 to 5 hours to accomplish sealing of the vias to the glass ceramic body.

The substrates were then cooled down in a two-step process. The first step was a cooldown from 975 to 700 degrees Centigrade in the same steam atmosphere. The ramp rate down was 1 to 3 degrees Centigrade/minute. The atmosphere was then switched to 100% $N_2$ and the substrates were cooled to room temperature at the same ramp rates.

After a lap and polish operation, and exposure to a dye penetrant, the substrates were cross-sectioned and then examined. It was determined that the dye penetrated only 4 to 5 mils below the surface. This is to be compared to a typical dye penetration throughout the entire substrate when the substrates are processed according to the prior art firing cycle.

The advantages of the invention are thus apparent.

Example 2

Substrates were prepared and fired according to the procedure of Example 1 except that the densification and crystallization step was ramped up to 900 degrees Centigrade where sealing was allowed to take place. Sealing of the vias to the glass ceramic body was accomplished by exposing the substrates to a nitrogen atmosphere for 1 hour followed by 5 hours in steam at an $H_2/H_2O$ concentration of $4-6\times10^{-4}$. The temperature was then ramped up to 975 degrees Centigrade at a ramp rate of 1 to 2 degrees/minute and held there for 1 to 2 hours to accomplish recrystallization. Cooldown was as before.

Sealing was comparable to that found in Example 1.

Example 3

Substrates were prepared and fired according to the procedure of Example 1 except that sealing and recrystallization were at 960 degrees Centigrade. At this temperature, there was a 1 hour hold in nitrogen followed by a 5 hour hold in steam at an $H_2/H_2O$ concentration of $6-9\times10^{-4}$.

There was complete sealing.

Example 4

Substrates were prepared and fired according to the procedure in Example 1 except that the substrates were initially ramped up to 725 degrees Centigrade where the atmosphere was changed to a steam ambient for binder burnoff. The binder burnoff process continued for 20 hours. Following this 20 hour hold at 725 degrees Centigrade, the firing cycle continued as in Example 1 except that the substrates were held for 3 hours in steam at 975° C. Cooldown proceeded as before in Example 1.

Sealing was comparable to that found in Example 1.

Example 5

Substrates were prepared and fired according to the procedure in Example 4 except that the substrates were initially ramped up to 745 degrees Centigrade. Thereafter, binder burnoff continued at 745 degrees Centigrade for 15 hours. The remainder of the firing cycle was as explained in Example 4.

Sealing was comparable to that found in Example 1.

In all of the preceding examples, the substrates produced according to the invention were free from gross macroscopic cracking.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for forming a co-fired glass ceramic structure comprising the steps of:
   forming at least one green sheet of a first crystallizable glass in a thermally decomposable binder;
   metallizing said green sheet with a pattern of conductive paste comprising conductive metal, a second crystallizable glass and a thermally decomposable binder, said pattern comprising at least one via;
   firing said green sheet according to the following firing cycle steps:
   a. preheating said green sheet to a first temperature in a furnace with a neutral or reducing ambient so as to effect pyrolysis of said thermally decomposable binders, wherein said first temperature is insufficient to coalesce said first crystallizable glass or said conductive paste;
   b. introducing a steam ambient into said furnace and then heating said green sheet in said furnace at said first temperature to burn off said pyrolyzed binders;
   c. replacing said steam ambient with a neutral or reducing ambient and raising the temperature to a second temperature to effect densification and crystallization of said first and second glasses;
   d. maintaining said second temperature for a predetermined time to effect sealing of said at least one via wherein for a first portion of said predetermined time, the ambient in said furnace is a neutral or reducing ambient and for a second portion of said predetermined time, the neutral or reducing ambient is replaced with a steam ambient; and
   e. cooling said structure.

2. The method of claim 1 further comprising the step, prior to cooling, of raising the temperature while in said steam ambient in step d. to a final temperature and holding at said final temperature to effect recrystallization of said first and second glasses.

3. The method of claim 1 wherein said second temperature is a final temperature at which recrystallization of said first and second glasses is effected.

4. The method of claim 1 wherein said conductive paste, after firing, comprises 30 to 50 volume percent conductive metal and 70 to 50 volume percent glass ceramic.

5. The method of claim 4 wherein said conductive paste, after firing, comprises 35 to 45 volume percent conductive metal and 65 to 55 volume percent glass ceramic.

6. The method of claim 5 wherein said conductive paste, after firing, comprises 40 volume percent conductive metal and 60 volume percent glass ceramic.

7. The method of claim 4 wherein said conductive metal comprises copper and said glass ceramic comprises cordierite.

8. The method of claim 1 wherein the step of cooling comprises first cooling the structure to a temperature less than said second temperature in a steam ambient and then replacing the steam ambient with a neutral ambient and cooling to room temperature.

9. The method of claim 8 wherein said temperature less than said second temperature is in the range of 900 to 400 degrees Centigrade.

10. The method of claim 8 wherein said neutral ambient consists essentially of nitrogen.

11. The method of claim 2 wherein said final temperature is insufficient to melt said conductive metal.

12. The method of claim 3 wherein said final temperature is insufficient to melt said conductive metal.

13. The method of claim 1 wherein said first and second crystallizable glasses comprise cordierite.

14. The method of claim 1 wherein the TCE of said first crystallizable glass is equal to or greater than the TCE of said second crystallizable glass.

15. The method of claim 1 wherein the ratio of $H_2/H_2O$ in said steam ambient of said binder burnoff step is maintained between $5 \times 10^{-5}$ and $2 \times 10^{-3}$.

16. The method of claim 1 wherein the ratio of $H_2/H_2O$ in said steam ambient at said second temperature is slightly oxidizing with respect to said conductive metal.

17. The method of claim 1 further comprising a drying step interposed between said binder burnoff and densification steps, said drying step comprising exposing said structure to a reducing ambient for a predetermined length of time at an elevated temperature that is insufficient to effect densification of said structure.

18. The method of claim 1 wherein the composition of said first crystallizable glass comprises, in weight percent, 55% $SiO_2$, 21.1% $Al_2O_3$, 22.3% $MgO$, 1.3% $B_2O_3$ and 0.3% $P_2O_5$.

19. The method of claim 1 wherein the composition of said second crystallizable glass is the same as said first crystallizable glass.

20. The method of claim 1 wherein the composition of said second crystallizable glass comprises, in weight percent, 55% $SiO_2$, 21.23% $Al_2O_3$, 20% $MgO$, 1% $B_2O_3$ and 2.77% $P_2O_5$.

21. The method of claim 1 wherein said first temperature is in the range of 690 to 750 degrees Centigrade.

22. The method of claim 1 wherein said second temperature is in the range of 900 to 1000 degrees Centigrade.

23. The method of claim 1 wherein there are a plurality of said green sheets and further comprising the steps of:
   metallizing at least one of said green sheets with a pattern of conductive paste comprising conductive metal, a thermally decomposable binder and no crystallizable glass; and
   prior to firing, stacking and laminating said metallized green sheets.

24. The method of claim 23 wherein there are a plurality of metallized green sheets having the conductive paste without the crystallizable glass and at least one metallized green sheet having the conductive paste with the crystallizable glass, the metallized green sheets being stacked such that the metallized green sheets having the conductive paste without the crystallizable glass are stacked together and the at least one metallized green sheet having the conductive paste with the crystallizable glass is placed either at the top or bottom of the stack.

25. The method of claim 23 wherein there are a plurality of metallized green sheets having the conductive paste without the crystallizable glass and a plurality of metallized green sheets having the conductive paste with the crystallizable glass, the metallized green sheets being stacked such that the metallized green sheets having the conductive paste without the crystallizable glass are stacked together and at least one each of the metallized green sheets having the conductive paste with the crystallizable glass is placed at the top and bottom of the stack.

26. The method of claim 1, prior to the step of metallizing, further comprising the step of forming the conductive metal of the conductive paste comprising mixing particles of CuO with particles of the second crystallizable glass and then exposing the mixture of particles to a reducing atmosphere for a time sufficient to reduce the CuO to elemental copper.

27. The method of claim 26 wherein said CuO particles have a particle size of about 2 microns or less.

28. The method of claim 26 wherein the exposing of the mixture of particles is in hydrogen at an elevated temperature less than about 600 degrees Centigrade.

29. The method of claim 1 wherein the ambient of step c is a reducing ambient.

30. The method of claim 1 wherein the ambient in the first portion of step d is a neutral ambient.

31. A method for forming a co-fired glass ceramic structure comprising at least one metallized green sheet of a first crystallizable glass in a thermally decomposable binder having a pattern of conductive paste comprising conductive metal, a second crystallizable glass and a thermally decomposable binder, said pattern comprising at least one via, the method comprising the steps of:

firing said green sheet according to the following firing cycle steps:
 a. preheating said green sheet to a first temperature in a furnace with a neutral or reducing ambient so as to effect pyrolysis of said thermally decomposable binders, wherein said first temperature is insufficient to coalesce said first crystallizable glass or said conductive paste;
 b. introducing a steam ambient into said furnace and then heating said green sheet in said furnace at said first temperature to burn off said pyrolyzed binders;
 c. replacing said steam ambient with a neutral or reducing ambient and raising the temperature to a second temperature to effect densification and crystallization of said first and second glasses;
 d. maintaining said second temperature for a predetermined time to effect sealing of said at least one via wherein for a first portion of said predetermined time, the ambient in said furnace is a neutral or reducing ambient and for a second portion of said predetermined time, the neutral or reducing ambient is replaced with a steam ambient; and
 e. cooling said structure.

32. The method of claim 31 further comprising the step, prior to cooling, of raising the temperature while in said steam ambient in step d to a final temperature and holding at said final temperature to effect recrystallization of said first and second glasses.

33. The method of claim 31 wherein said second temperature is a final temperature at which recrystallization of said first and second glasses is effected.

34. The method of claim 31 wherein said conductive paste, after firing, comprises 30 to 50 volume percent conductive metal and 70 to 50 volume percent glass ceramic.

35. The method of claim 34 wherein said conductive paste, after firing, comprises 35 to 45 volume percent conductive metal and 65 to 55 volume percent glass ceramic.

36. The method of claim 35 wherein said conductive paste, after firing, comprises 40 volume percent conductive metal and 60 volume percent glass ceramic.

37. The method of claim 34 wherein said conductive metal comprises copper and said glass ceramic comprises cordierite.

38. The method of claim 31 wherein the step of cooling comprises first cooling the structure to a temperature less than said second temperature in a steam ambient and then replacing the steam ambient with a neutral ambient and cooling to room temperature.

39. The method of claim 38 wherein said temperature less than said final temperature is in the range of 900 to 400 degrees Centigrade.

40. The method of claim 38 wherein said neutral ambient consists essentially of nitrogen.

41. The method of claim 32 wherein said final temperature is insufficient to melt said conductive metal.

42. The method of claim 33 wherein said final temperature is insufficient to melt said conductive metal.

43. The method of claim 31 wherein said first and second crystallizable glasses comprise cordierite.

44. The method of claim 31 wherein the TCE of said first crystallizable glass is equal to or greater than the TCE of said second crystallizable glass.

45. The method of claim 31 wherein the ratio of $H_2/H_2O$ in said steam ambient of said binder burnoff step is maintained between $5 \times 10^{-5}$ and $2 \times 10^{-3}$.

46. The method of claim 31 wherein the ratio of $H_2/H_2O$ in said steam ambient at said second temperature is slightly oxidizing with respect to said conductive metal.

47. The method of claim 31 further comprising a drying step interposed between said binder burnoff and densification steps, said drying step comprising exposing said structure to a reducing ambient for a predetermined length of time at an elevated temperature that is insufficient to effect densification of said structure.

48. The method of claim 31 wherein the composition of said first crystallizable glass comprises in weight percent, 55% $SiO_2$, 21.1% $Al_2O_3$ 22.3% $MgO$, 1.3% $B_2O_3$ and 0.3% $P_2O_5$.

49. The method of claim 31 wherein the composition of said second crystallizable glass is the same as said first crystallizable glass.

50. The method of claim 31 wherein the composition of said second crystallizable glass comprises, in weight percent, 55% $SiO_2$, 21.23% $Al_2O_3$, 20% $MgO$, 1% $B_2O_3$ and 2.77% $P_2O_5$.

51. The method of claim 31 wherein said first temperature is in the range of 690 to 750 degrees Centigrade.

52. The method of claim 31 wherein said second temperature is in the range of 900 to 1000 degrees Centigrade.

53. The method of claim 31 wherein the ambient of step c is a reducing ambient.

54. The method of claim 31 wherein the ambient in the first portion of step d is a neutral ambient.

55. A method for forming a co-fired glass ceramic structure comprising a plurality of stacked and laminated metallized green sheets of a first crystallizable glass in a thermally decomposable binder, at least one of the metallized green sheets having a pattern of conductive paste comprising conductive metal, a second crystallizable glass and a thermally decomposable binder, said pattern comprising at least one via, and at least one of the metallized green sheets having a pattern of conductive paste comprising conductive metal, a thermally decomposable binder and no crystallizable glass, the method comprising the steps of:

firing said green sheets according to the following firing cycle steps:
 a. preheating said green sheets to a first temperature in a furnace with a neutral or reducing ambient so as to effect pyrolysis of said thermally decomposable binders, wherein said first temperature is insufficient to coalesce said first crystallizable glass or said conductive paste;
 b. introducing a steam ambient into said furnace and then heating said green sheets in said furnace at said first temperature to burn off said pyrolyzed binders;
 c. replacing said steam ambient with a neutral of reducing ambient and raising the temperature to a second temperature to effect densification and crystallization of said first and second glasses;
 d. maintaining said second temperature for a predetermined time to effect sealing of said at least one via wherein for a first portion of said predetermined time, the ambient in said furnace is a neutral or reducing ambient and for a second portion of said predetermined time, the neutral or reducing ambient is replaced with a steam ambient; and
 e. cooling said structure.

56. The method of claim 55 further comprising the step, prior to cooling, of raising the temperature while in said steam ambient in step d to a final temperature and holding at said final temperature to effect recrystallization of said first and second glasses.

57. The method of claim 55 wherein said second temperature is a final temperature at which recrystallization of said first and second glasses is effected.

58. The method of claim 51 wherein said steam ambient is slightly oxidizing with respect to said conductive metal.

59. The method of claim 55 wherein the ambient of step c is a reducing ambient.

60. The method of claim 55 wherein the ambient in the first portion of step d is a neutral ambient.

* * * * *